United States Patent
Hong et al.

(10) Patent No.: US 9,648,731 B2
(45) Date of Patent: May 9, 2017

(54) CARRIER TAPE FOR TAB-PACKAGE AND MANUFACTURING METHOD THEREOF

(71) Applicant: LG INNOTEK CO., LTD., Seoul (KR)

(72) Inventors: Tae Ki Hong, Seoul (KR); Jun Young Lim, Seoul (KR); Ki Tae Park, Seoul (KR); Sang Ki Cho, Seoul (KR); Dae Sung Yoo, Seoul (KR); Han Mo Koo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 17 days.

(21) Appl. No.: 14/175,137

(22) Filed: Feb. 7, 2014

(65) Prior Publication Data

US 2014/0151093 A1    Jun. 5, 2014

Related U.S. Application Data

(63) Continuation of application No. 13/188,882, filed on Jul. 22, 2011.

(30) Foreign Application Priority Data

Oct. 1, 2010    (KR) .................... 10-2010-0096018

(51) Int. Cl.
*H05K 1/09*    (2006.01)
*H05K 1/00*    (2006.01)
(Continued)

(52) U.S. Cl.
CPC ......... *H05K 1/028* (2013.01); *H01L 23/4985* (2013.01); *H01L 24/50* (2013.01); *H01L 2924/01029* (2013.01); *H01L 2924/14* (2013.01)

(58) Field of Classification Search
CPC ............. H01L 23/49565; H01L 24/79; H01L 2224/0405; H01L 2224/50; H01L 2224/79;
(Continued)

(56) References Cited

U.S. PATENT DOCUMENTS 5,126,824 A    6/1992  Ueda
5,288,950 A    2/1994  Ushio et al.
(Continued)

FOREIGN PATENT DOCUMENTS

CN    1150334 A    5/1997
CN    1510743 A    7/2004
(Continued)

OTHER PUBLICATIONS

Sumitomo (JP2004259774A) provided with Office Action.*
(Continued)

*Primary Examiner* — Chau N Nguyen
*Assistant Examiner* — Roshn Varghese
(74) *Attorney, Agent, or Firm* — Saliwanchik, Lloyd & Eisenschenk (57) ABSTRACT

The present invention relates to a method for manufacturing a TAB tap. The method includes forming a circuit pattern region having input/output terminal pattern on a base film, and forming an exposing region at a convey region having a sprocket hole for exposing the base film. Accordingly, the present invention provides a TAB tape that improves reliability of a product by fundamentally preventing the generation of metal particles by forming exposing regions that expose a base film through selectively etching and removing a metal layer of a convey region formed at both side of a TAB tape and having a sprocket hole, and that prevents (Continued)

short-circuit by partially removing a base film at a predetermined region not having a circuit pattern formed thereon through etching.

18 Claims, 5 Drawing Sheets

(51) Int. Cl.
  *H05K 1/02* (2006.01)
  *H01L 23/00* (2006.01)
  *H01L 23/498* (2006.01)

(58) Field of Classification Search
  CPC ....... H01L 2224/86; H01L 2224/02235; H01L 24/50; H01L 24/86; H01L 23/49572; H05K 1/0281; H05K 2201/10681; H05K 2201/09063; H05K 2201/2009
  USPC ......................................... 174/257, 266, 268
  See application file for complete search history.

(56) References Cited

U.S. PATENT DOCUMENTS

| | | | |
|---|---|---|---|
| 5,345,039 A | 9/1994 | Yamazaki | |
| 5,923,080 A | 7/1999 | Chun | |
| 6,300,577 B1 | 10/2001 | Tsujii | |
| 6,313,526 B1 | 11/2001 | Nakamura | |
| 6,320,135 B1 | 11/2001 | Saito | |
| 7,060,364 B2 | 6/2006 | Kataoka et al. | |
| 2004/0017001 A1* | 1/2004 | Chung et al. | 257/678 |
| 2004/0224436 A1* | 11/2004 | Naito | H01L 21/4839 29/827 |
| 2006/0054349 A1* | 3/2006 | Iguchi | 174/255 |
| 2007/0108631 A1* | 5/2007 | Nakamura et al. | 438/617 |
| 2009/0011186 A1* | 1/2009 | Yeh | H05K 3/0097 428/137 |
| 2009/0011591 A1* | 1/2009 | Imamura | 438/618 |

FOREIGN PATENT DOCUMENTS

| | | | |
|---|---|---|---|
| CN | 1697592 A | | 11/2005 |
| JP | S61265852 A | | 11/1986 |
| JP | 2002-299385 A | | 10/2002 |
| JP | 2004-259774 A | | 9/2004 |
| JP | 2004259774 A | * | 9/2004 |
| JP | 2004-281946 A | | 10/2004 |
| JP | 2005116908 A | | 4/2005 |
| JP | 2005-217307 A | | 8/2005 |
| JP | 2006120867 A | | 5/2006 |
| JP | 2008-004855 A | | 1/2008 |
| KR | 10-2003-0054883 A | | 7/2003 |
| KR | 10-2003-0077408 A | | 10/2003 |
| KR | 10-2004-0058061 A | | 7/2004 |
| TW | 2009-42112 A | | 10/2009 |

OTHER PUBLICATIONS

English Translation of Sumitomo (JP2004259774A) provided with Office Action.*
English Machine Translation of Ogawa (JP2004-281946 A).*
English Translation of Nitto (JP2008-004855A) provided with Office Action.*
Office Action dated Aug. 21, 2015 in Chinese Application No. 2011110205218.7.
Office Action dated Dec. 25, 2013 in Chinese Application No. 201110205218.7.
Office Action dated Aug. 7, 2013 in U.S. Appl. No. 13/188,882.
Office Action dated Nov. 19, 2014 in U.S. Appl. No. 13/188,882.
Office Action dated Sep. 10, 2013 in Japanese Application No. 2011-155165.

* cited by examiner

FIG.1

PRIOR ART

CARRIER TAPE FOR TAB-PACKAGE AND MANUFACTURING METHOD THEREOF

CROSS-REFERENCE TO RELATED APPLICATIONS

This application is a continuation of U.S. application Ser. No. 13/188,882, filed Jul. 22, 2011, which claims the benefit under 35 U.S.C. §119 of Korean Patent Application No. 10-2010-0096018, filed Oct. 1, 2010, which are hereby incorporated by reference in their entirety.

BACKGROUND OF THE INVENTION

Field of the Invention

The present invention relates to a Tape Automated Bonding (TAB) tape and a method for manufacturing the same.

Description of the Background Art

Many technologies have been introduced for semiconductor packages. Among them, a Tape Automated Bonding (TAB) technology has been receiving attention as a chip mounting method using an Inner Lead Bonding (ILB) technology. The TAB technology is a technology for continuously processing a package assembling process in a reel to reel manner. Typically, a package manufactured using the TAB technology is referred as a TAB package.

Figure 1:
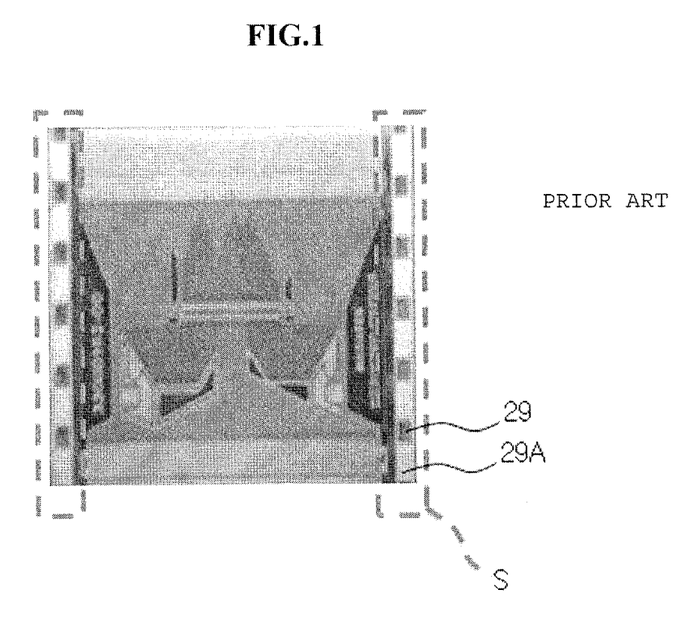
FIG. 1 is a diagram illustrating a typical TAB tape package.

FIG. 1 is a diagram illustrating a TAB tape for a typical TAB package.

As shown, the TAB tape includes a metal plating layer S exposed at a region S where sprocket holes 29 formed thereon. Such a metal plating layer is essentially formed of a Cu layer or a Cu+Sn layer by carrying out a metal plating process on an insulating film during a process of forming a circuit pattern. After forming the circuit pattern, a Cu metal layer is formed around the sprocket holes, thereby exposing the metal layer.

As described above, the TAB tape of the typical TAB package includes a conductive metal layer such as a Cu layer or a Cu+Sn layer on one side of a base film. Accordingly, a scratch is essentially formed on the surface of the Cu layer or the Cu+Sn layer when driving a display device. Such a scratch causes defect due to generation or spreading of foreign substance. Particularly, a Cu chunk flows out when a penal and a driving IC are assembled. It may cause decreasing predictability of a panel manufacturing process and reliability thereof due to such increment of defects.

BRIEF SUMMARY

Accordingly, an aspect of the present invention is to solve at least the problems and disadvantages of the background art. In an embodiment of the present invention, a Cu layer or a metal layer is not formed around sprocket holes where friction is generated by a driving roller during a process of assembling a driver IC, a Chip/drive IC, and a panel. Accordingly, foreign substance such as Cu particle is not generated. Further, a thickness of a region exposing a base film is thicker than that of a region not exposing a base film. Accordingly, a factor causing short-circuit is eliminated, and a reliable TAB tape can be manufactured.

In accordance with an aspect of the present invention, a method for manufacturing a Tape Automated Bonding (TAB) tape includes: forming a circuit pattern region including an input/output terminal pattern on a base film; forming an exposing region for exposing a surface of the base film at a convey region, wherein the convey region includes sprocket holes formed at the base film.

The forming a circuit pattern region may include: stacking a seed metal layer or a conductive metal layer on the base film; and forming a circuit pattern through selectively etching the conductive metal layer.

The forming a circuit pattern region may further include: after the forming a circuit pattern through selectively etching, removing the seed metal layer from a region not having the circuit pattern formed thereon in the convey region.

In the removing the seed metal layer, the seed metal layer may be removed through an etching solution, and the etching solution includes Ni or Cr components.

In the forming a circuit pattern region and the forming an exposing region, an exposing region for exposing the base film may be simultaneously formed by coating a photoresist and carrying out an exposing process using a photo mask having a predetermined pattern for selectively removing the circuit pattern and the convey region.

In the exposing a surface, the seed metal layer and the conductive metal layer are etched to form a metal pattern at an outer side of the sprocket holes in the convey region.

The method may further include: after the forming a circuit pattern region and the forming an exposing region, etching partially the exposed surface of the base film.

The base film may be a polyimide film.

The method may further include: performing a surface activating process for forming a single plating process layer or a multiple layered plating process layer on the circuit pattern using Cu, Ni, Pd, Au, Sn, Ag, Co, and combination thereof.

In accordance with another aspect of the present invention, a Tape Automated Bonding (TAB) tape includes: a circuit pattern region including an input/output terminal pattern formed on a base film; and a convey region including sprocket holes formed at both sides of the base film, wherein the convey region includes an exposing region for exposing the base film.

A thickness of a region exposing the base film or a thickness of a region exposing the convey region may be thinner than a region not exposing the base film.

A seed metal layer including Ni or Cr may be disposed between the circuit pattern and the base film.

The TAB tape may further include: a plating process layer formed on the circuit pattern as a single plating process layer or a multiple layered plating process layer using Cu, Ni, Pd, Au, Sn, Ag, Co, and combination thereof.

The exposing region at the convey region may further include a metal pattern formed at outer sides of the sprocket holes.

The metal plating layer pattern may be adjacent to the sprocket hole.

The metal plating layer pattern may be separated from the sprocket hole.

The pattern region may include at least one line type metal pattern separated from the sprocket hole.

BRIEF DESCRIPTION OF THE DRAWINGS

The invention will be described in detail with reference to the following drawings in which like numerals refer to like elements.

The file of this patent contains at least one drawing executed in color. Copies of this patent with color drawings will be provided by the Patent and Trademark Office upon request and payment of the necessary fee.

DETAILED DESCRIPTION

Preferred embodiments of the present invention will be described in a more detailed manner with reference to the drawings.

It is an object of the present invention to provide a TAB tape that improves reliability of a product by fundamentally preventing the generation of metal particles by forming exposing regions exposing a base film through selectively etching and removing a metal layer of a convey region formed at both side of a TAB tape and having a sprocket hole, and that prevents short-circuit by partially removing a base film at a predetermined region not having a circuit pattern formed thereon through etching.

In order to prevent the generation of metal particles and short-circuit, a method for manufacturing a TAB tap according to an exemplary embodiment includes forming a circuit pattern region having input/output terminal pattern on a base film, and forming an exposing region at a convey region having a sprocket hole for exposing the base film.

A TAB tape manufactured by the manufacturing method according to an exemplary embodiment of the present invention includes: a circuit pattern region including an input/output terminal pattern formed on a base film; and a convey region including sprocket holes formed at both sides of the base film. The convey region includes an exposing region for exposing the base film. In this case, a thickness of a region exposing the base film or a thickness of a region exposing the convey region is thinner than a region not exposing the base film.

Hereinafter, the present invention will be describe more fully with reference to the accompanying drawings, in which exemplary embodiments of the present invention. The drawings and description are to be regarded as illustrative in nature and not restrictive. Like reference numerals designate like elements throughout the specification.

Figure 2:
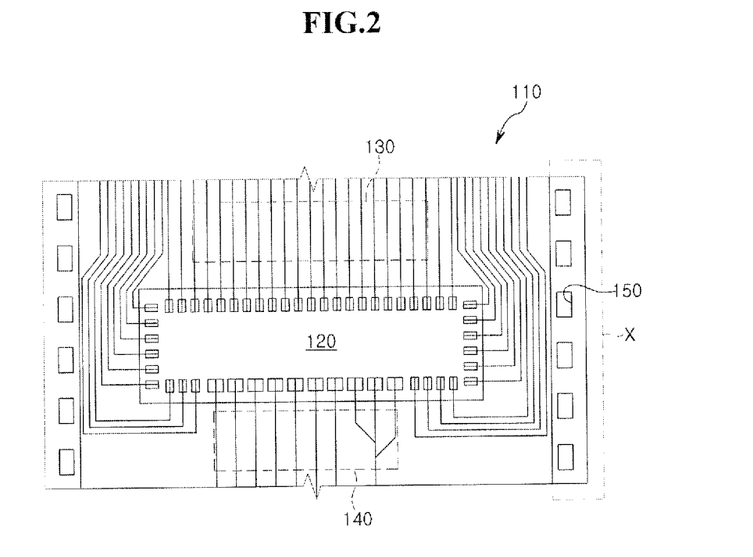
FIG. 2 is a diagram illustrating a TAB tape according to an exemplary embodiment of the present invention.

FIG. 2 is a diagram schematically illustrates a TAB tape according to an exemplary embodiment of the present invention. FIG. 2 shows general configuration of a TAB tape. Particularly, a TAB tape includes a convey region x having sprocket holes 150. The TAB tape according to the present exemplary embodiment can be used for both of a TCP structure and a COF structure. Particularly, the TAB tape according to the present exemplary embodiment will be described to be used for a COF package.

The TAB tape according to the present exemplary embodiment includes an output circuit pattern 130, an input circuit pattern 140, an inner lead region 120 where a chip is mounted, and a convey region x having sprocket holes 150 for a conveying process by a roll.

The convey region x according to the present exemplary embodiment is significantly different from a typical convey region in a view of layers forming the convey region. The convey region x according to the present exemplary embodiment includes a region exposing a base film. That is, the convey region x according to the present exemplary embodiment includes a region where a Cu metal pattern layer or a Sn metal pattern layer is not formed. Accordingly, the foreign substance problem is significantly reduced.

Figure 3:
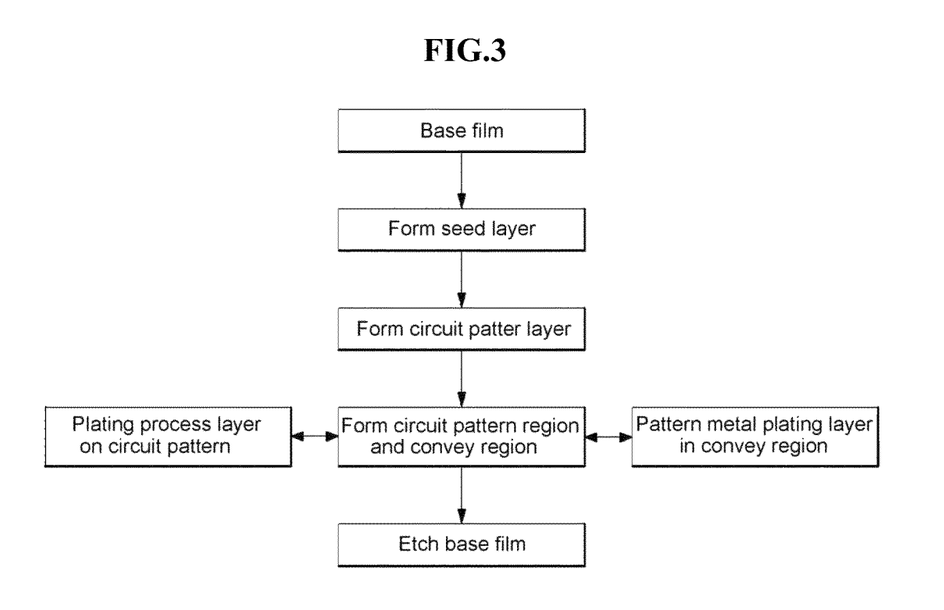
FIGS. 3 and 4 are diagrams illustrating a method for manufacturing a TAB tape according to an exemplary embodiment of the present invention.
Figure 4:
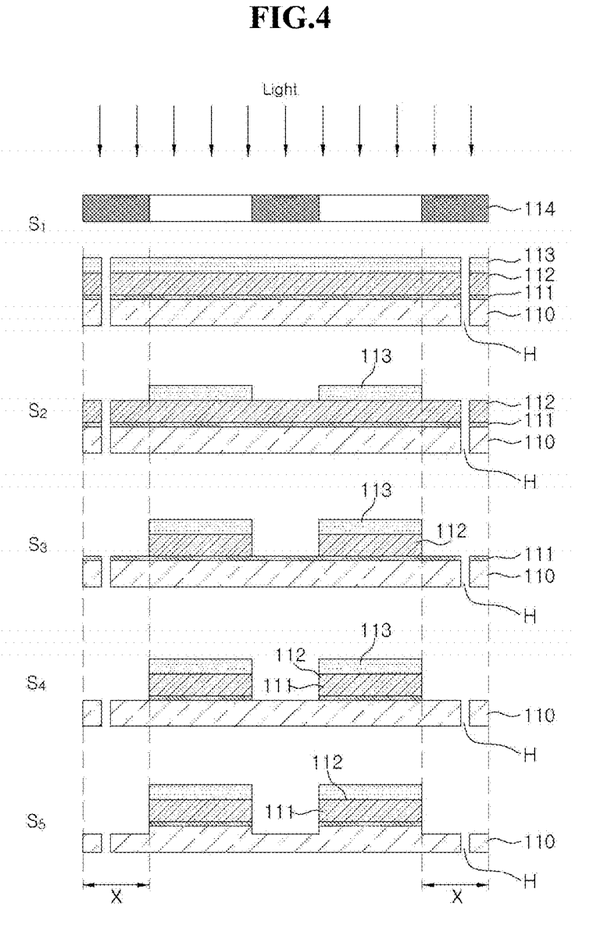

FIGS. 3 and 4 are diagrams illustrating a method for manufacturing a TAB tape according to an exemplary embodiment of the present invention. As shown, a method for manufacturing a TAB tape according to the present exemplary embodiment includes forming a circuit pattern region having an input/output terminal pattern on a base film, and forming an exposing region that exposes a surface of the base film at the convey region having sprocket holes formed an outer side of the base film.

First Embodiment

(1) Forming a Circuit Pattern and an Exposing Region of a Convey Period

Referring to FIG. 4, a seed metal layer 111 or a conductive metal layer 112 is formed on a base film 110. At step S1, the seed metal layer 111 or the conductive metal layer 110 is formed until the convey region x. The convey region x includes sprocket holes H. The sprocket holes H are formed by a mechanical punching process. The base film 110 may be a polyimide film, a polyamide film, polyester, polyphenylene sulphide (PPS), poly ester amide, or liquid crystal polymer. Particularly, an insulating film such as a polyimide film is used as the base film in the present exemplary embodiment of the present invention. The insulating film such as a polyimide film is not easily deformed by heat generated when a seed metal layer is formed. Further, the insulating film such as the polyimide film has acid resistance and alkali resistance property. Accordingly, the insulating film is not eroded away by an etching solution used for etching or an alkali solution used for cleaning. Moreover, the insulating film has heat-resisting property. Accordingly, the insulating film is not easily deformed by heat generated when a seed metal layer is formed.

In the present exemplary embodiment of the present invention, the seed metal layer is formed on the base film. However, the seed metal layer may be omitted because the seed metal layer is disposed only for improving adherence of the base film and the conductive metal layer. The seed metal layer may be formed on the polyimide using a dry film forming method such as deposition or sputtering. The seed metal layer improves the adherence of the base film and the conductive metal layer.

At step S2, a photoresist 113 is deposited on the conductive metal layer 112 and a circuit pattern is formed through exposure using the photo mask 114 as medium. In the step S2, a predetermined part of the photoresist corresponding to the convey region is removed through shielding during exposure (It is obvious that the corresponding part of the photoresist is removed through exposure when a negative photoresist is used). A predetermined part of photoresist pattern may be remained through a predetermined pattern when a metal pattern plating layer is formed at the convey region x.

At step S3, the circuit pattern is formed by selectively etching the conductive metal layer 112 using the patterned photoresist 113 as medium. Although the accompanying drawings show that the entire conductive metal layer corresponding to the convey region is removed, a predetermined metal pattern may be remained through selective etching when a predetermined metal pattern is formed around sprocket holes.

An etching solution for etching Cu component may be used. For example, the etching solution may be an etching solution having ferric chloride as major component, an etching solution having cupric chloride as major component, or sulfuric acid+hydrogen peroxide. Such etching solution has a function for easily removing the seed metal layer by finely etching a predetermined part of the seed metal layer.

(2) Removing a Seed Metal Layer

At step S4, a predetermined part of the seed metal layer, which does not have the circuit pattern formed thereon, may be removed as shown in FIG. 4. Furthermore, the seed metal layer is completely removed from the convey region x to expose the base film. Or, the seed metal layer is partially removed from the convey region x to expose the base film. In this case, the seed metal layer is not removed from a part having a metal pattern formed thereon.

The seed metal layer is made of a metal layer Ni or Cr in the exemplary embodiment of the present invention. Accordingly, an etching solution that can remove Ni and Cr is used. Such an etching solution may include a composing solution of sulfuric acid and hydrochloric acid, an aqueous solution of potassium permanganate·KOH, an aqueous solution of potassium bichromate, and an aqueous solution of sodium permanganate+NaOH.

As described above, various TAB tapes may be manufactured through the manufacturing method according to the exemplary embodiment of the present invention. That is, the generation of foreign substances can be significantly reduced by forming the exposing regions for exposing the base film through selectively or entirely removing the metal layer or the metal plating layer of the convey region. In detail, the metal pattern is formed at an outer area of the sprocket hole and the predetermined pattern is formed to be close to or to be separated from the sprocket hole. That is, the exposing region is formed to expose the base film except a metal pattern formed for providing a mechanical strength required for a base film convey operation through a roll. It is obvious that modifications of patterns of the exposing region are included in the scope of the present invention.

Second Embodiment Including a Process of Etching a Base Film

Etching a Base Film

As described above, the TAB tape for obtaining a required mechanical strength and minimizing the generation of metal foreign substance can be manufactured through the step S4. Hereinafter, a method for manufacturing a TAB tape according to another exemplary embodiment of the present invention will be described. That is, a process of etching the base film is additionally included after the step S4.

That is, the process of etching a predetermined part of the base film is performed by controlling the etching solution such as an aqueous solution of potassium permanganate·KOH, an aqueous solution of potassium bichromate, and an aqueous solution of sodium permanganate+NaOH. However, the present invention is not limited to the etching solutions.

Referring to FIG. 4, after forming the circuit pattern and the exposing region of the convey region at the steps S1 to S4, the base film is removed through etching the exposed surface of the base film 110 using an etching solution at the step S5. That is, the base film is partially removed except the region of the base film where the circuit pattern formed thereon. Accordingly, a thickness of a part having the circuit pattern formed thereon becomes different from a thickness of other part not having the circuit pattern formed thereon. In detail, a part not having the circuit pattern becomes further thinner. Accordingly, the circuit pattern can be prevented from short-circuit.

In case of a TAB tape including the metal seed layer, the base film may be removed simultaneously when the seed metal layer is removed using the etching solution. In case of a TAB tape not including a seed metal layer, the base film may be etched through an additional process using the etching solutions.

Figure 5:
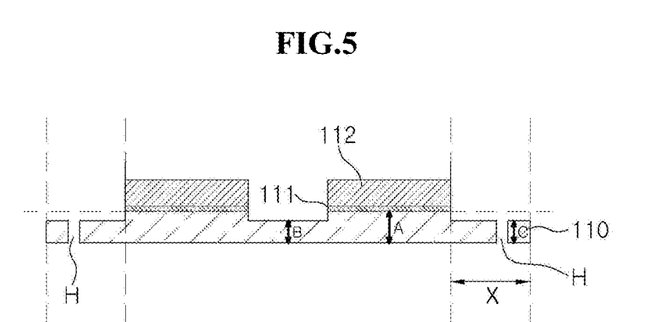
FIG. 5 is a cross-section view of a TAB tape according to an exemplary embodiment of the present invention.
Figure 6:
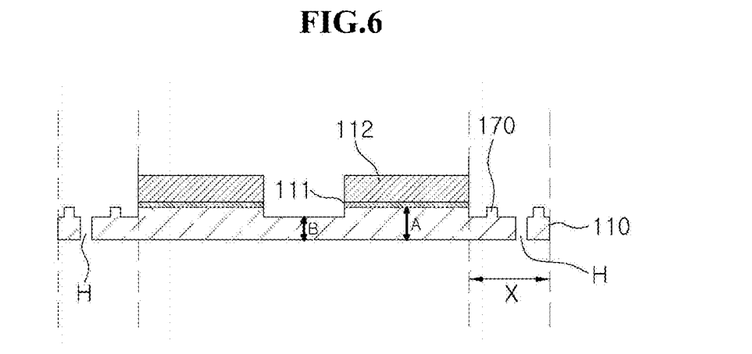
FIG. 6 is a cross-section view of a TAB tape according to another exemplary embodiment of the present invention.

FIGS. 5 and 6 are cross-section views of TAB tape manufactured through the manufacturing method according to the second embodiments of the present invention.

The TAB tape includes a circuit pattern region including an input/output terminal pattern 112 formed on a base film 110 and a convey region x having sprocket holes H formed at both sides of the base film. Particularly, the convey region includes an exposing region. The exposing region exposes a predetermined part of the base film.

As shown, the convey region is not covered by a metal layer. There is no a metal layer formed around the sprocket holes. Accordingly, metal foreign substance is not generated when a conveying process is performed.

The base film 110 of the TAB tape according to the exemplary embodiment of the present invention may have a uniform thickness as shown in the structure of the step S4. However, in case of additionally performing the step S5 for etching the base film, the thickness B of a region exposing the base film in the circuit pattern region or the thickness C of the exposing region of the convey region is thinner than a thickness A of a region not exposing the base film.

A seed metal layer 111 may be disposed between the circuit pattern 112 and the base film 110. The seed metal layer may be formed of copper, nickel, chrome, molybdenum, tungsten, silicon, palladium, titanium, vanadium, steel, cobalt, manganese aluminum, zinc, tin, tantalum, or combination thereof. The seed metal layer may be formed of one of the above metals or the combination thereof. The seed metal layer is preferably made of nickel, chrome, or combination thereof.

Further, a single plating processing layer (not shown) or a multiple layered plating processing layer (not shown) may be additionally formed on the circuit pattern 112 through a surface activation process. For example, the single plating processing layer and the multiple layered plating processing layer may be formed of Cu, Ni, Pd, Au, Sn, Ag, Co, or combination thereof.

When a predetermined metal pattern 170 is formed at the convey region x as shown in FIG. 6, the metal pattern is formed at an outer side of the sprocket holes H. As described above, the thickness C of the base film exposed at the convey region becomes thinner than that of the base film not exposed at the convey region where no metal pattern is formed in the convey region.

Figure 7:
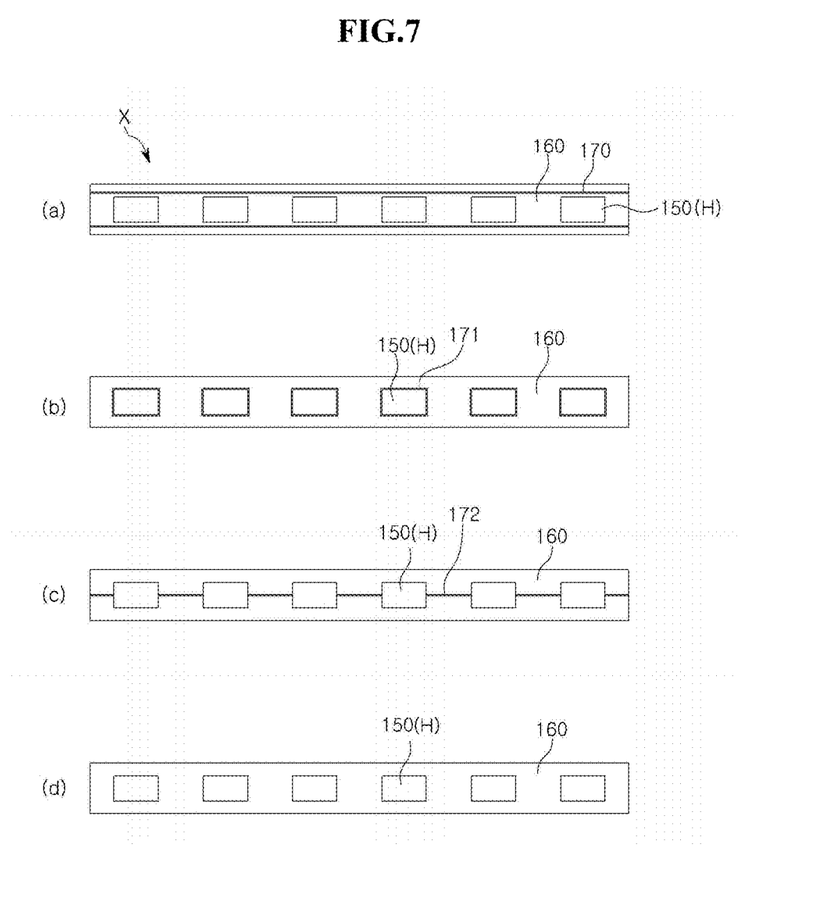
FIG. 7 is an enlarged view of a convey region of a TAB tape according to an exemplary embodiment of the present invention.

FIG. 7 illustrates a method of manufacturing a convey region x in accordance with an embodiment of the present invention.

Referring to a diagram (a), a convey region x includes an exposing region 160 exposing a base film and sprocket holes 150 formed at a predetermined gap. At least one plating line 170 may be formed at a predetermined distance separated from the sprocket hole. That is, a metal plating layer pattern may be formed around the sprocket hole. In the present embodiment, the metal pattern is formed as the plating line 170.

Referring to a diagram (b), a metal pattern 171 is formed to surround the sprocket hole. Although the metal pattern 171 is completely surround the sprocket hole 150 in the diagram (b), the metal pattern 171 may be formed to partially surround the sprocket hole 150.

That is, the metal pattern according to the exemplary embodiment is formed at the outer side of the sprocket hole. Such a metal pattern includes a pattern structure close to the sprocket hole and a pattern structure separated from the sprocket hole. That is, an exposing region is formed for exposing the base film except regions having the metal pattern formed thereon for providing the mechanical strength required for conveying the base film by selectively removing the metal layer entirely formed on the convey region. It is obvious that various modifications of the exposing region may be made within the scope of the present invention.

Regarding to a diagram (c), as the metal plating pattern, a plating line 172 is formed to be adjacent to an outer side of a sprocket hole. The entire convey region may be formed as the exposing region by removing the metal layer of the conveying region as shown in a diagram (d). In this case, the required mechanical strength may be secured by controlling the thickness of the base film.

Figure 8:
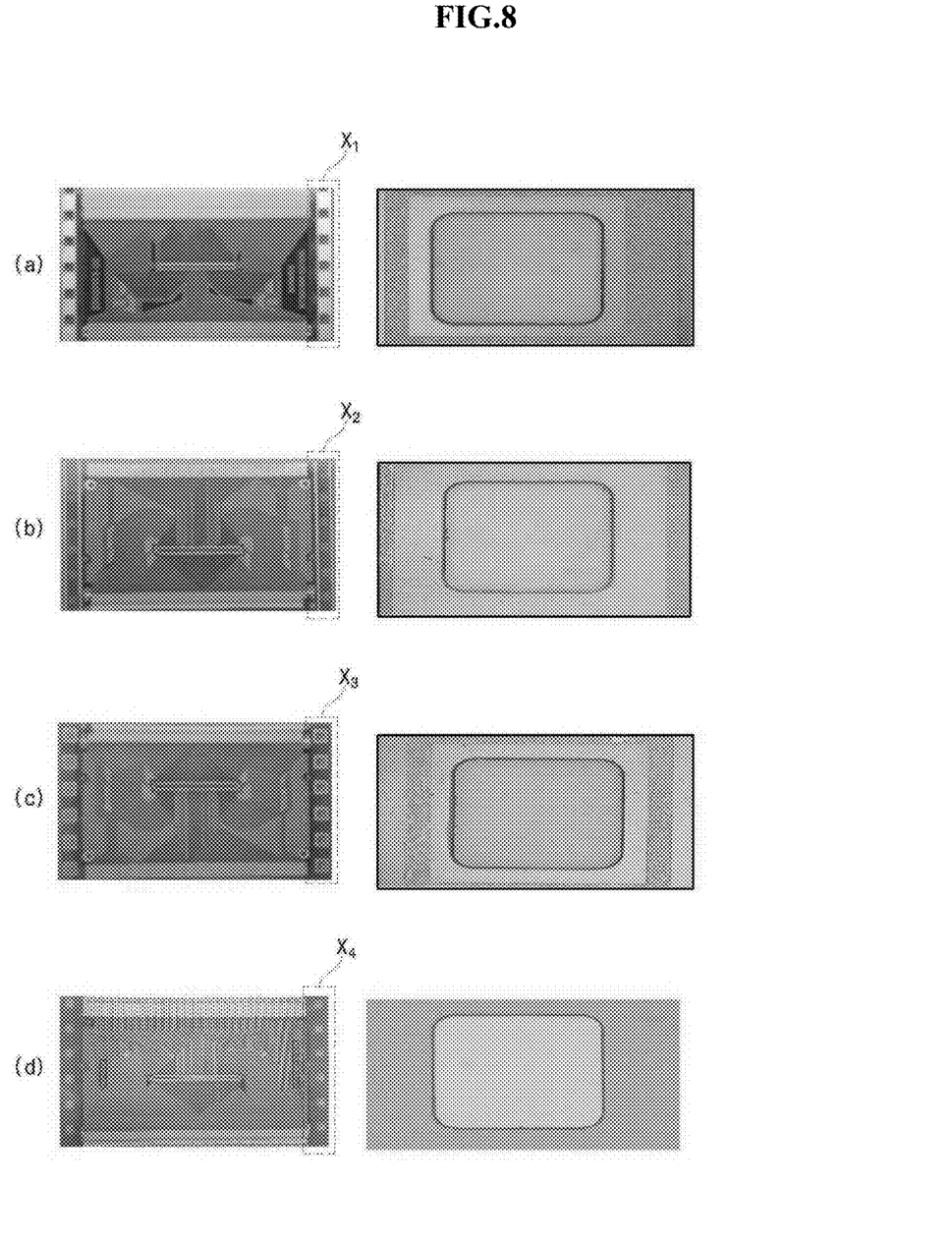
FIG. 8 is a picture illustrating foreign substance generated in a convey region of a TAB tape according to an embodiment of the present invention.

FIG. 8 is an image of a real TAB tape manufactured by a manufacturing method according to an exemplary embodiment of the present invention.

Regarding a diagram (a), a left picture illustrates a typical TAB tape having a Cu layer or a Cu+Sn layer formed on a convey region X1. A right picture shows that a significant amount of foreign substances is generated around sprocket holes.

Regarding a diagram (b), a left picture illustrates that an exposing region is formed at a convey region X2 and a metal plating layer pattern is formed as a plating line according to an exemplary embodiment of the present invention. A right picture shows metal foreign substance such as Sn is not significantly generated.

Regarding a diagram (c), a left picture illustrates that an exposing region is formed at a convey region X3 and a metal plating layer pattern is formed around a sprocket hole. A right picture shows that metal foreign substance such as Sn is not significantly generated.

Regarding a diagram (d), a left picture illustrates that a metal layer of a convey region X4 is entirely removed. A right picture shows that metal foreign substance such as Sn is not significantly generated.

The foregoing exemplary embodiments and aspects of the invention are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

According to an embodiment of the present invention, a Cu layer or a metal layer is not formed around sprocket holes where friction is generated by a driving roller during a process of assembling a driver IC, a Chip/drive IC, and a panel. Accordingly, foreign substance such as Cu particle is not generated, and a reliable product can be manufactured.

Further, according to an embodiment of the present invention, a thickness of a region exposing a base film is thicker than that of a region not exposing a base film. Accordingly, a factor causing short-circuit is eliminated, and a reliable TAB tape can be manufactured.

What is claimed is:

1. A tape comprising:
    a base film;
    a circuit region including a circuit pattern on the base film; and
    a convey region including sprocket holes of an outer side of the circuit region, and an exposing part to which the base film is exposed;
    wherein the convey region further comprises a metal pattern separated from the sprocket holes,
    wherein a thickness of the base film on which the exposing part is formed is thinner than a thickness of the base film on which the circuit pattern is formed,
    wherein a top surface of the base film on which the exposing part is formed is lower than a top surface of the base film on which the circuit pattern is formed,
    wherein the base film is an insulating film,
    wherein the metal pattern comprises:
        a first metal pattern formed at first sides of the sprocket holes to extend along a length direction of the convey region and separated from the sprocket holes; and
        a second metal pattern formed at second sides of the sprocket holes to extend along the length direction of the convey region and separated from the first metal pattern and the sprocket holes,
    wherein the first and second metal patterns are disposed at a predetermined distance separated from each edge part of the sprocket holes,
    wherein the first and second metal patterns are extended along the length direction and are absent between the sprocket holes, and
    wherein an entire top surface of the base film in the convey region disposed between the first and second metal patterns is exposed.

2. The tape of claim 1, wherein the sprocket holes comprise a first sprocket hole and a second sprocket hole disposed adjacent to the first sprocket hole,
    wherein the first metal pattern formed at the first side of the first sprocket hole is contacted with the first metal pattern formed at the first side of the second sprocket hole,
    wherein the second metal pattern formed at the second side of the first sprocket hole is contacted with the second metal pattern formed at the second side of the second sprocket hole, and
    wherein an entire top surface of the base film in the convey region disposed between the first and second sprocket holes is exposed.

3. The tape of claim 1, wherein the circuit pattern includes any one of Cu, Ni, Pd, Au, Sn, Ag, and Co, or a binary alloy and a ternary alloy thereof.

4. The tape of claim 1, wherein the circuit pattern and the metal pattern are made of the same material.

5. The tape of claim 1, wherein the circuit pattern and the metal pattern are made of different materials from each other.

6. The tape of claim 1, further comprising a seed layer between the base film and the circuit pattern.

7. The tape of claim 1, further comprising a seed layer between the base film and the metal pattern.

8. The tape of claim 1, further comprising a seed layer between the base film and the circuit pattern or between the base film and the metal pattern, wherein the seed layer includes one element selected from among Cu, Ni, Cr, Mo, W, Si, Pd, Ti, V, Fe, Co, Mn, Zn, Sn, and Ta, a mixture of at least two elements selected from among them, or an alloy thereof.

9. A tape comprising:
a base film;
a circuit region including a circuit pattern on the base film; and
a convey region including sprocket holes of an outer side of the circuit region, a metal pattern in a line type, and an exposing part to which the base film is exposed;
wherein a thickness of the base film on which the exposing part is formed is thinner than a thickness of the base film on which the circuit pattern is formed,
wherein a top surface of the base film on which the exposing part is formed is lower than a top surface of the base film on which the circuit pattern is formed,
wherein the base film is an insulating film,
wherein the metal pattern comprises:
a first metal pattern formed at first sides of the sprocket holes to extend along a length direction of the convey region and separated from the sprocket holes; and
a second metal pattern formed at second sides of the sprocket holes to extend along the length direction of the convey region and separated from the first metal pattern and the sprocket holes,
wherein the first and second metal patterns are disposed at a predetermined distance separated from each edge part of the sprocket holes,
wherein the first and second metal patterns are extended along the length direction and are absent between the sprocket holes, and
wherein an entire top surface of the base film in the convey region disposed between the first and second metal patterns is exposed.

10. The tape of claim 9, wherein the sprocket holes comprise a first sprocket hole and a second sprocket hole disposed adjacent to the first sprocket hole,
wherein the first metal pattern formed at the first side of the first sprocket hole is contacted with the first metal pattern formed at the first side of the second sprocket hole, and
wherein the second metal pattern formed at the second side of the first sprocket hole is contacted with the second metal pattern formed at the second side of the second sprocket hole.

11. A tape comprising:
a base film;
a circuit region including a circuit pattern on the base film; and
a convey region including sprocket holes of an outer side of the circuit region, and an exposing part to which the base film is exposed;
wherein a thickness of the base film on which the exposing part is formed is thinner than a thickness of the base film on which the circuit pattern is formed,
wherein a top surface of the base film on which the exposing part is formed is lower than a top surface of the base film on which the circuit pattern is formed,
wherein the base film is an insulating film,
wherein the convey region further comprises a metal pattern,
wherein the metal pattern is configured such that a pair of metal patterns is formed at both sides of the sprocket holes to extend along a length direction of the convey region,
wherein the metal pattern comprises:

a first metal pattern formed at first sides of the sprocket holes to extend along the length direction of the convey region and separated from the sprocket holes; and
a second metal pattern formed at second sides of the sprocket holes to extend along the length direction of the convey region and separated from the first metal pattern and the second sprocket holes,
wherein the first and second metal patterns are disposed at a predetermined distance separated from each edge part of the sprocket holes,
wherein the first and second metal patterns are extended along the length direction and are absent between the sprocket holes, and
wherein an entire top surface of the base film in the convey region disposed between the first and second metal patterns is exposed.

12. A tape comprising:
a base film;
a circuit region including a circuit pattern on the base film;
a convey region including a plurality of sprocket holes of an outer side of the circuit region and an exposing part to which the base film is exposed;
a first metal pattern formed at first sides of the sprocket holes to extend along a length direction of the convey region and separated from the sprocket holes; and
a second metal pattern formed at second sides of the sprocket holes to extend along the length direction of the convey region and separated from the first metal pattern and the sprocket holes,
wherein a thickness of the base film on which the exposing part is formed is thinner than a thickness of the base film on which the circuit pattern is formed,
wherein a top surface of the base film on which the exposing part is formed is lower than a top surface of the base film on which the circuit pattern is formed,
wherein the base film is an insulating film,
wherein the first and second metal patterns are disposed at a predetermined distance separated from each edge part of the sprocket holes,
wherein the first and second metal patterns are extended along the length direction and are absent between the sprocket holes, and
wherein an entire top surface of the base film in the convey region disposed between the first and second metal patterns is exposed.

13. The tape of claim 12, wherein the convey region has a structure in which an entire surface of the base film is exposed to remaining regions except for a region in which the sprocket holes are formed.

14. The tape of claim 12, further comprising a metal pattern in the convey region.

15. The tape of claim 14, wherein a thickness of the base film on which the metal pattern of the convey region is present is different from that of a part to which a surface of the base film is exposed.

16. The tape of claim 15, wherein the thickness of the base film on which the metal pattern of the convey region is present is thicker than that of the part to which the surface of the base film is exposed.

17. The tape of claim 12, wherein the convey region is configured such that a thickness of the base film on which a metal pattern is present is different from that of a part to which a surface of the base film is exposed.

18. The tape of claim 17, wherein the thickness of the base film on which the metal pattern is present is thicker than that of the part to which the surface of the base film is exposed.

* * * * *